(12) United States Patent
Wang et al.

(10) Patent No.: US 11,640,941 B2
(45) Date of Patent: May 2, 2023

(54) SEMICONDUCTOR DEVICES INCLUDING METAL GATE PROTECTION AND METHODS OF FABRICATION THEREOF

(71) Applicant: TAIWAN SEMICONDUCTOR MANUFACTURING COMPANY, LTD., Hsinchu (TW)

(72) Inventors: Sheng-Tsung Wang, Hsinchu (TW); Lin-Yu Huang, Hsinchu (TW); Cheng-Chi Chuang, New Taipei (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 70 days.

(21) Appl. No.: 17/185,817

(22) Filed: Feb. 25, 2021

(65) Prior Publication Data
US 2022/0270971 A1 Aug. 25, 2022

(51) Int. Cl.
*H01L 23/535* (2006.01)
*H01L 29/423* (2006.01)
*H01L 29/417* (2006.01)
*H01L 29/66* (2006.01)

(52) U.S. Cl.
CPC ...... *H01L 23/535* (2013.01); *H01L 29/41733* (2013.01); *H01L 29/42392* (2013.01); *H01L 29/66742* (2013.01)

(58) Field of Classification Search
CPC ............. H01L 23/535; H01L 29/41733; H01L 29/42392; H01L 29/66742
USPC .......................................................... 257/401
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2016/0308008 A1* | 10/2016 | Yeo ................ H01L 29/66545 |
| 2020/0373391 A1* | 11/2020 | Yi .................... H01L 29/775 |

* cited by examiner

*Primary Examiner* — Tong-Ho Kim
(74) *Attorney, Agent, or Firm* — NZ Carr Law Office

(57) ABSTRACT

Embodiments of the present disclosure provide semiconductor device structures. In one embodiment, the semiconductor device structure includes a gate dielectric layer, a gate electrode layer in contact with the gate dielectric layer, a first self-aligned contact (SAC) layer disposed over the gate electrode layer, an isolation layer disposed between the gate electrode layer and the first SAC layer, and a first sidewall spacer in contact with the gate dielectric layer, the isolation layer, and the first SAC layer.

18 Claims, 15 Drawing Sheets

SEMICONDUCTOR DEVICES INCLUDING METAL GATE PROTECTION AND METHODS OF FABRICATION THEREOF

BACKGROUND

An integrated circuit (IC) typically includes a plurality of semiconductor devices, such as field-effect transistors and metal interconnection layers formed on a semiconductor substrate. The semiconductor industry has experienced continuous rapid growth due to constant improvements in the performance of various electronic components, including the gates which are used to alter the flow of current between a source and a drain. However, the performance of the gates may suffer due to damage to the gates during processing of the ICs. Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
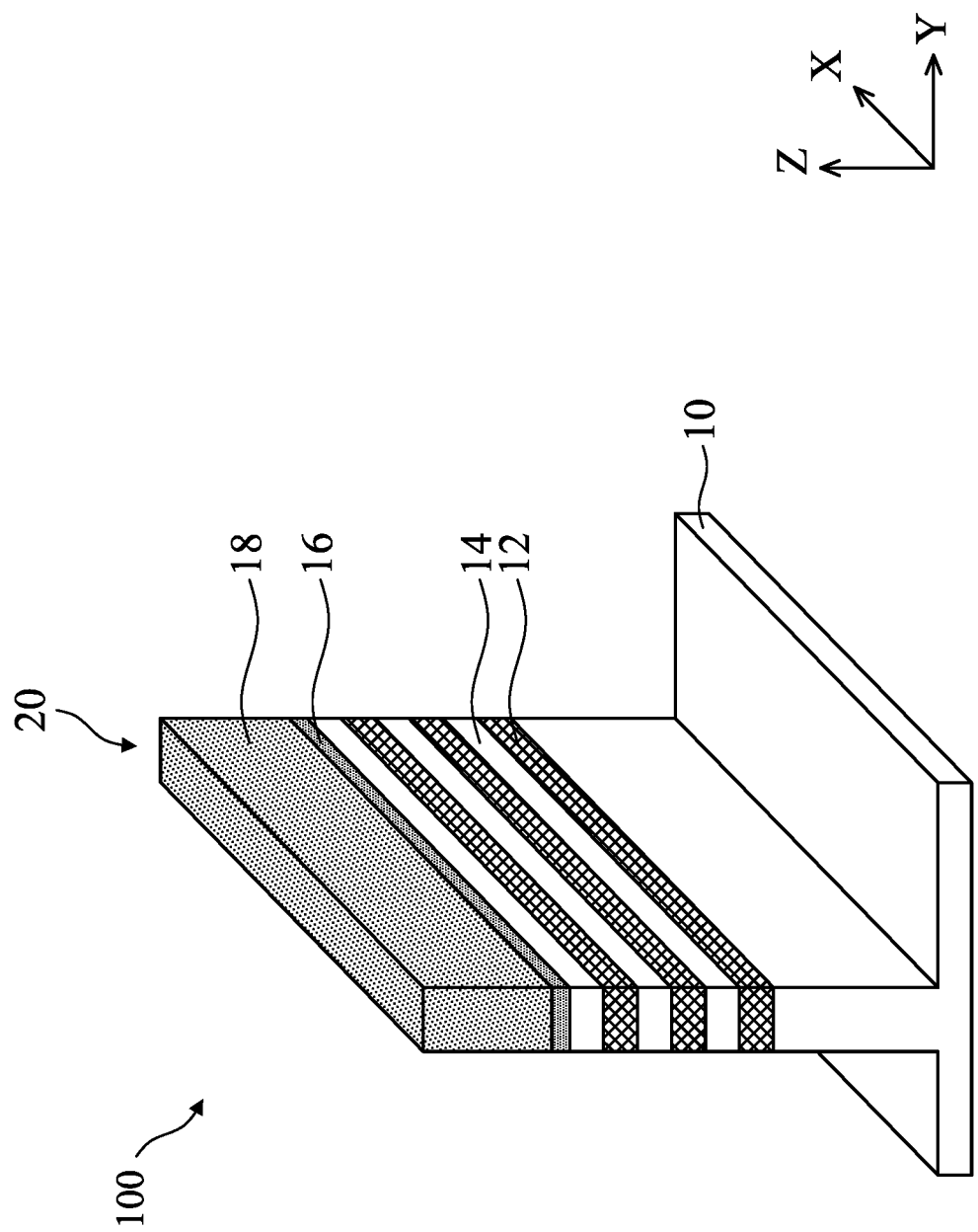
FIGS. 1-4 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

While the embodiments of this disclosure are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure.

FIGS. 1-16 show exemplary processes for manufacturing a semiconductor device structure 100 according to embodiments of the present disclosure. It is understood that additional operations can be provided before, during, and after processes shown by FIGS. 1-16, and some of the operations described below can be replaced or eliminated, for additional embodiments of the method. The order of the operations/processes is not limiting and may be interchangeable.

FIGS. 1-4 are perspective views of various stages of manufacturing a semiconductor device structure 100 in accordance with some embodiments. As shown in FIG. 1, a fin structure 20 is formed over a semiconductor substrate 10. The substrate 10 is provided to form a semiconductor device structure 100 thereon. The substrate 10 may include a single crystalline semiconductor material such as, but not limited to Si, Ge, SiGe, GaAs, InSb, GaP, GaSb, InAlAs, InGaAs, GaSbP, GaAsSb, and InP. The substrate 10 may include various doping configurations depending on circuit design. For example, different doping profiles, e.g., n-wells, p-wells, may be formed in the substrate 10 in regions designed for different device types, such as nFET and pFET. In some embodiments, the substrate 10 may be a silicon-on-insulator (SOI) substrate including an insulator structure (e.g., oxide) disposed between two silicon layers for enhancement.

To form the fin structure 20, one or more pairs of first semiconductor layer 12 and second semiconductor layer 14 are formed over the substrate 10. The semiconductor layers 12, 14 may be formed by a molecular beam epitaxy (MBE) process, a metalorganic chemical vapor deposition (MOCVD) process, and/or other suitable epitaxial growth processes. In some embodiments, the semiconductor layers 14 include the same material as the substrate 10. In some embodiments, the semiconductor layers 12 and 14 include different materials than the substrate 10. In some embodiments, the semiconductor layers 12 and 14 are made of materials having different lattice constants. The first semiconductor layers 12 in channel regions may eventually be removed and serve to define a vertical distance between adjacent channel regions of a subsequently formed multi-gate device. In some embodiments, the first semiconductor layers 12 include an epitaxially grown silicon germanium (SiGe) layer and the second semiconductor layers 14 include an epitaxially grown silicon (Si) layer. Alternatively, in some embodiments, either of the semiconductor layers 12 and 14 may include other materials such as Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

The fin structure 20 is formed by patterning a pad layer 16 and a hard mask 18 formed on the pairs of semiconductor layers 12, 14, and then etching through the pairs of semiconductor layers 12, 14 and a portion of the substrate 10.

Figure 2:
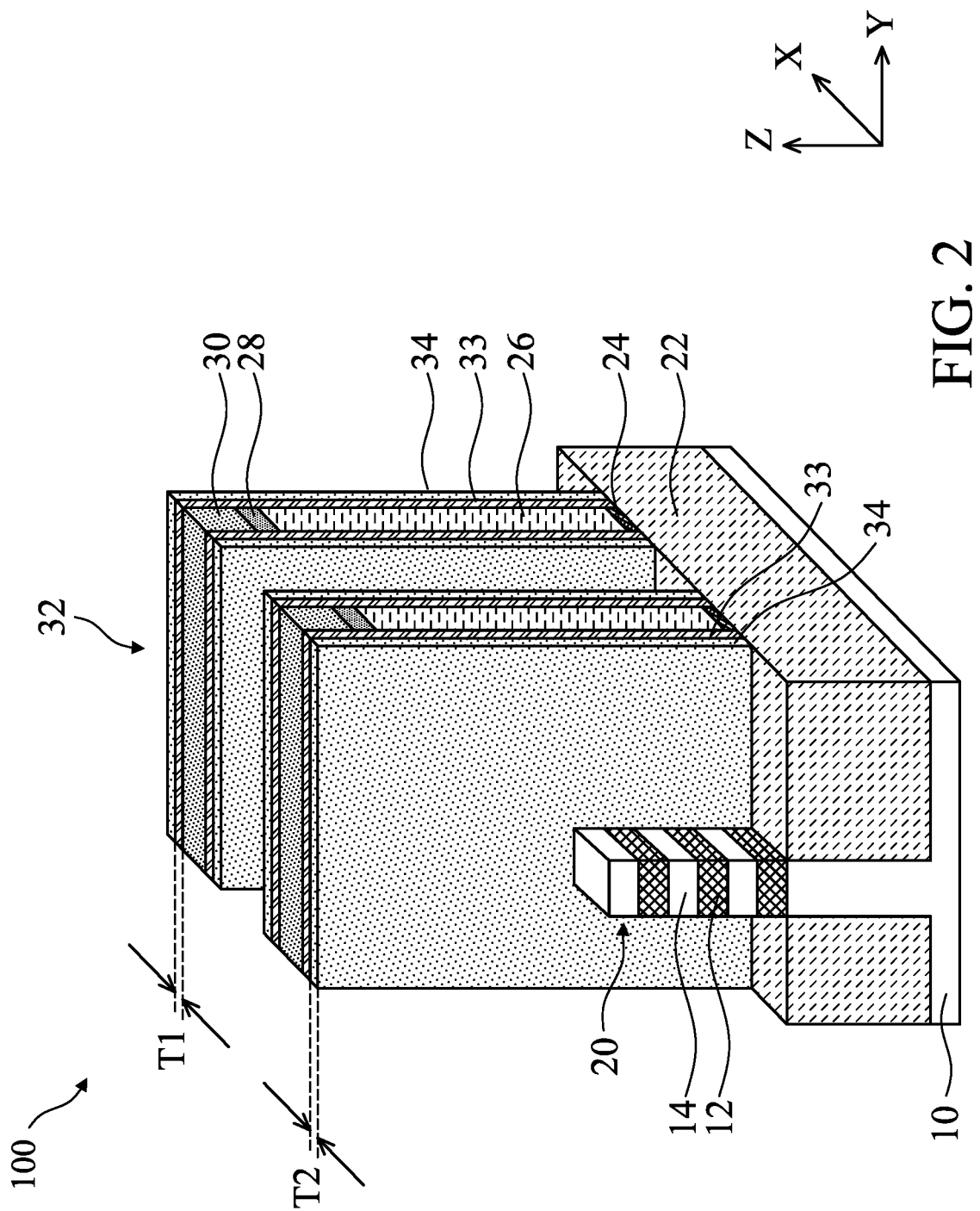

As shown in FIG. 2, after formation of the fin structure 20, an isolation layer 22 is formed in trenches between the fin structures 20. The isolation layer 22 is formed over the substrate 10 and then etched back to expose the pairs of semiconductor layers 12, 14. A top surface of the isolation layer 22 may be level with or below a surface of the bottommost first semiconductor layer 12 in contact with the substrate 10. In some embodiments, the isolation layer 22 may include silicon oxide, silicon nitride, silicon oxynitride, fluorine-doped silicate glass (FSG), a low-k dielectric, combinations thereof.

Sacrificial gate structures 32 are then formed over the fin structure 20, and sidewall spacers 33, 34 are formed on sides of the sacrificial gate structure 32. The sacrificial gate structures 32 may include a sacrificial gate dielectric layer 24, a sacrificial gate electrode layer 26, a pad layer 28, and a mask layer 30. The sacrificial gate dielectric layer 24 may include one or more layers of dielectric material, such as $SiO_2$, SiN, a high-k dielectric material, and/or other suitable dielectric material. The sacrificial gate electrode layer 26 may include silicon such as polycrystalline silicon or amorphous silicon. The pad layer 28 may include silicon nitride. The mask layer 30 may include silicon oxide. Next, a patterning operation is performed on the mask layer 30, the pad layer 28, the sacrificial gate electrode layer 26 and the sacrificial gate dielectric layer 24 to form the sacrificial gate structure 32.

The sidewall spacers 33, 34 are formed on sidewalls of each sacrificial gate structure 32. The sidewall spacers 33, 34 may be made of any suitable dielectric material. In some embodiments, the sidewall spacer 33 may include or be formed of a dielectric material, such as SiN, ZrSi, SiCN, ZrAlO, TiO, TaO, ZrO, LaO, ZrN, SiC, ZnO, SiOC, HfO, LaO, AlO, SiOCN, HfSi, AlON, YO, TaCN, SiO, or any combination thereof. The sidewall spacer 33 may have a thickness T1 of about 1 nm to about 10 nm. Likewise, the sidewall spacer 34 may include or be formed of the same material as the sidewall spacer 33. The sidewall spacer 34 may have a thickness T2 of about 1 nm to about 10 nm. In some embodiments, the sidewall spacer 33 and the sidewall spacer 34 are formed of different material. For example, the sidewall spacer 33 may be formed of a silicon oxide-based material such as SiO and the sidewall spacer 34 may be formed of a silicon nitride-based material, such as SiN. While FIG. 2 shows the sidewall spacers 33, 34, in some embodiments either one of the sidewall spacers 33, 34 can be omitted.

Figure 3:
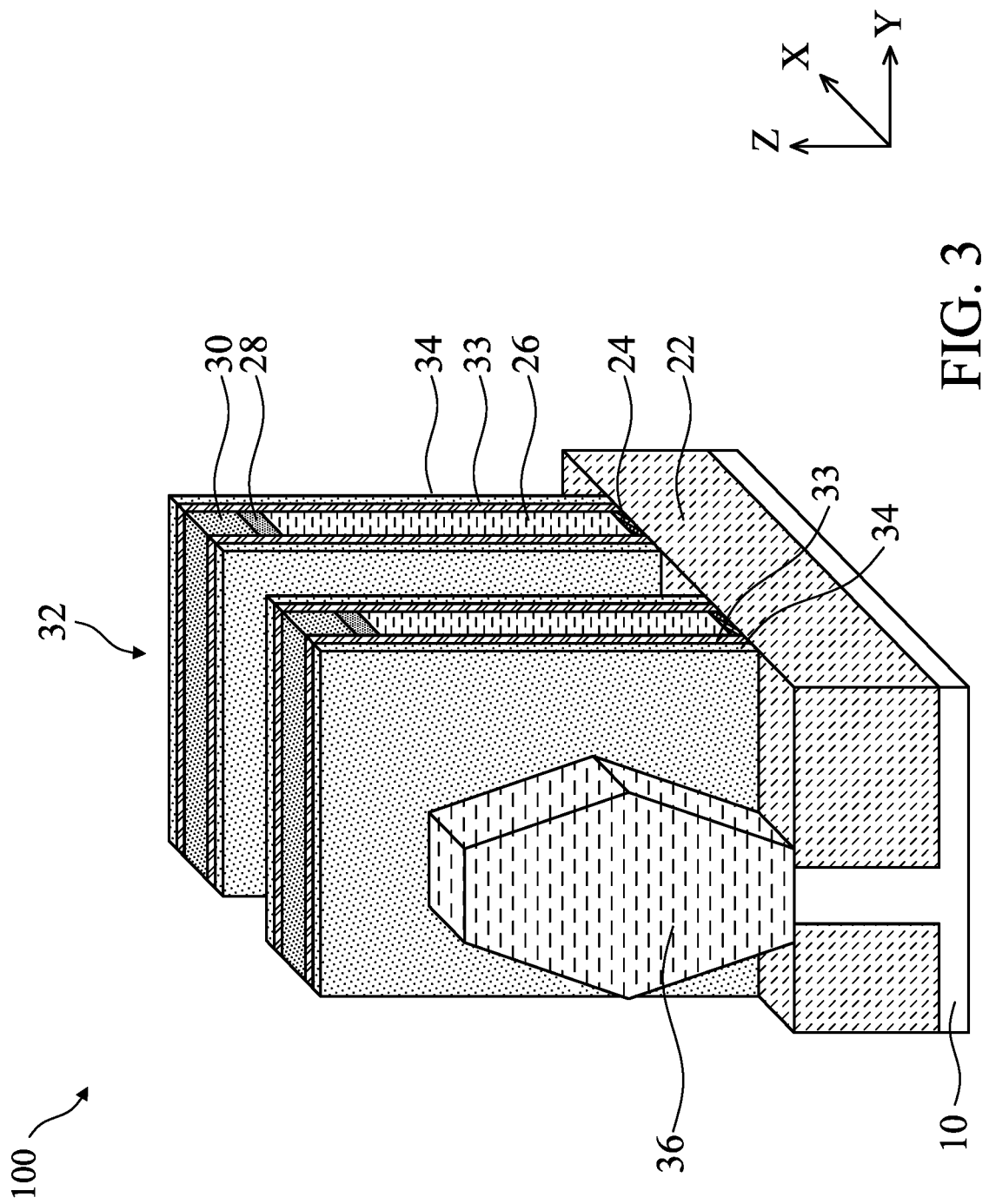

As shown in FIG. 3, source/drain features 36 are formed on opposing sides of the sacrificial gate structures 32. Source/drain features 36 may be formed by etching back portions of the fin structure 20 exposed outside or not covered by the sacrificial gate structures 32, etching back the first semiconductor layers 12 from under the sidewall spacers 33, 34 to form inner spacer cavities, forming inner spacers 35 (shown in FIG. 5) in the inner spacer cavities, and epitaxially growing the source/drain features 36 from the exposed surface of the substrate 10 and the second semiconductor layers 14.

The inner spacers 35 may be formed from a dielectric material, such as SiO, SiN, SiC, SiCN, SiOC, SiON, SiOCN, or a combination thereof. In some embodiments, the inner spacers 35 may include one of silicon nitride (SiN) and silicon oxide ($SiO_2$), SiOCN, or a combination thereof.

The source/drain features 36 may include one or more semiconductor materials depending on the device type. The source/drain features 36 may be epitaxially grown material with a thickness in a range between about 0.5 nm to about 30 nm.

For n-type devices, the source/drain features 36 may include one or more layers of Si, SiP, SiC, SiCP, or a group III-V material (InP, GaAs, AlAs, InAs, InAlAs, InGaAs). In some embodiments, the source/drain features 36 may be doped with n-type dopants, such as phosphorus (P), arsenic (As), etc, for n-type devices.

For p-type devices, the source/drain features 36 may include one or more layers of Si, SiGe, SiGeB, Ge, or a group III-V material (InSb, GaSb, InGaSb). In some embodiments, the source/drain features 36 may be doped with p-type dopants, such as boron (B).

Figure 4:
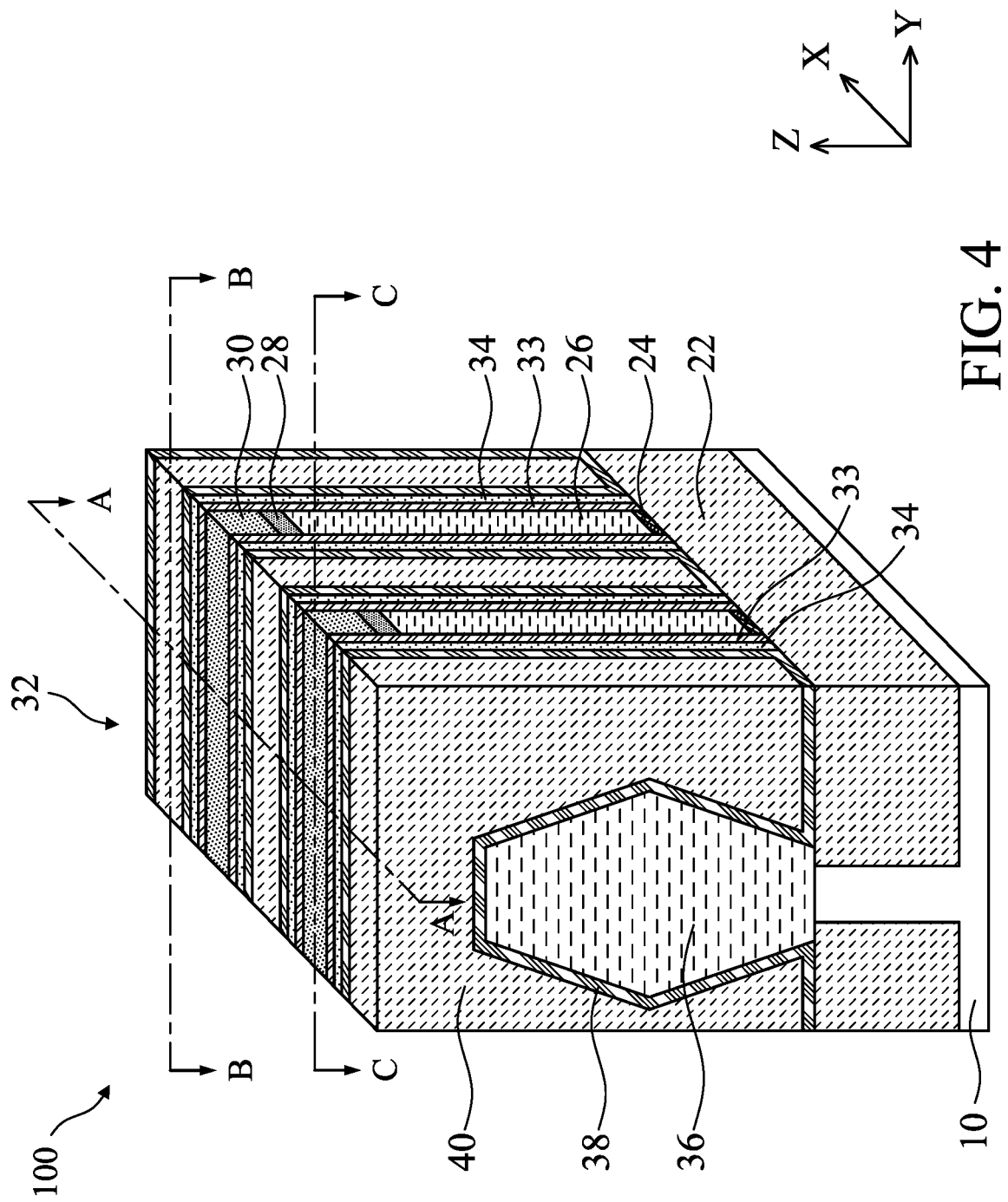

As shown in FIG. 4, a contact etch stop layer (CESL) 38 and an interlayer dielectric (ILD) layer 40 are formed over the exposed surfaces. In one embodiment, the CESL 38 is formed on the source/drain features 36, the sidewall spacers 33, 34, and the isolation layer 22. The CESL 38 may include or be formed of any suitable material, such as SiN, SiON, ZrSi, SiCN, ZrAlO, TiO, TaO, ZrO, LaO, ZrN, SiC, ZnO, SiOC, HfO, LaO, AlO, SiOCN, Si, HfSi, AlON, YO, TaCN, SiO, or any combination thereof, and may be formed by CVD, PVD, or ALD. The CESL 38 may have a thickness of about 1 nm to about 10 nm. In some embodiments, the CESL 38 may be formed from a material different from the sidewall spacers 33, 34 so that the sidewall spacers 33, 34 can be selectively etched back in the subsequent process to form first SAC layers.

The interlayer dielectric (ILD) layer 40 is formed over the contract etch stop layer (CESL) 38. The materials for the ILD layer 40 include compounds comprising Si, O, C, and/or H, such as silicon oxide, SiCOH and SiOC. Organic materials, such as polymers, may be used for the ILD layer 40. The ILD layer 40 protects the source/drain features 36 during the removal of the sacrificial gate structures 32. A planarization operation, such as CMP, is performed to expose the sacrificial gate electrode layer 26 for subsequent removal of the sacrificial gate structures 32.

Figure 16:
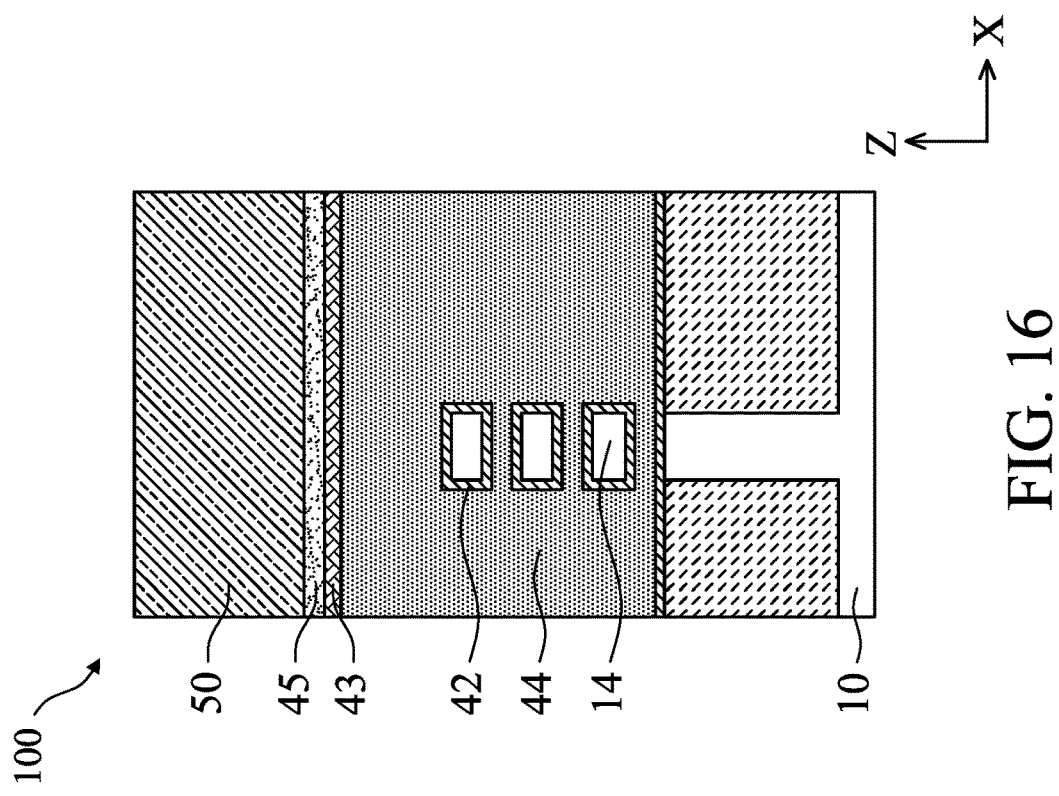
FIG. 16 is a cross sectional view of the semiconductor device structure along line C-C of FIG. 4 in accordance with some embodiments.
Figure 15:
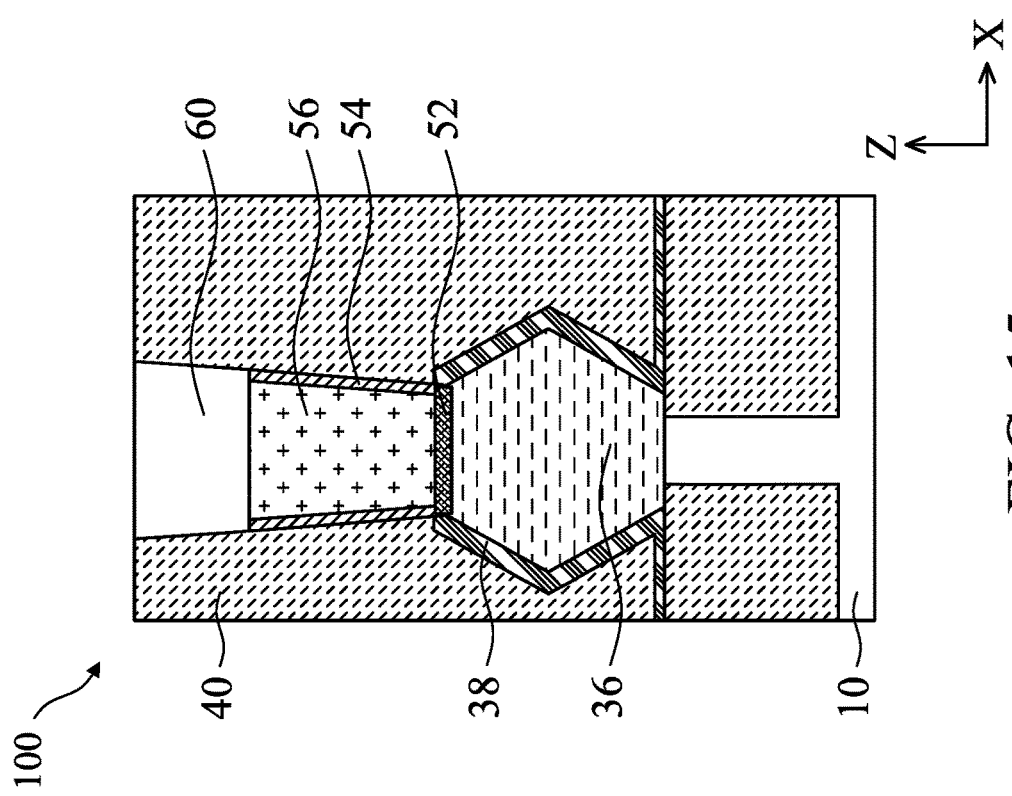
FIG. 15 is a cross sectional view of the semiconductor device structure along line B-B of FIG. 4 in accordance with some embodiments.

FIGS. 5-14 are cross sectional views of the semiconductor device structure 100 along line A-A of FIG. 4 at various stages of fabrication according to embodiments of the present disclosure. FIG. 15 is a cross sectional view of the semiconductor device structure 100 along line B-B of FIG. 4. FIG. 16 is a cross sectional view of the semiconductor device structure 100 along line C-C of FIG. 4.

Figure 5:
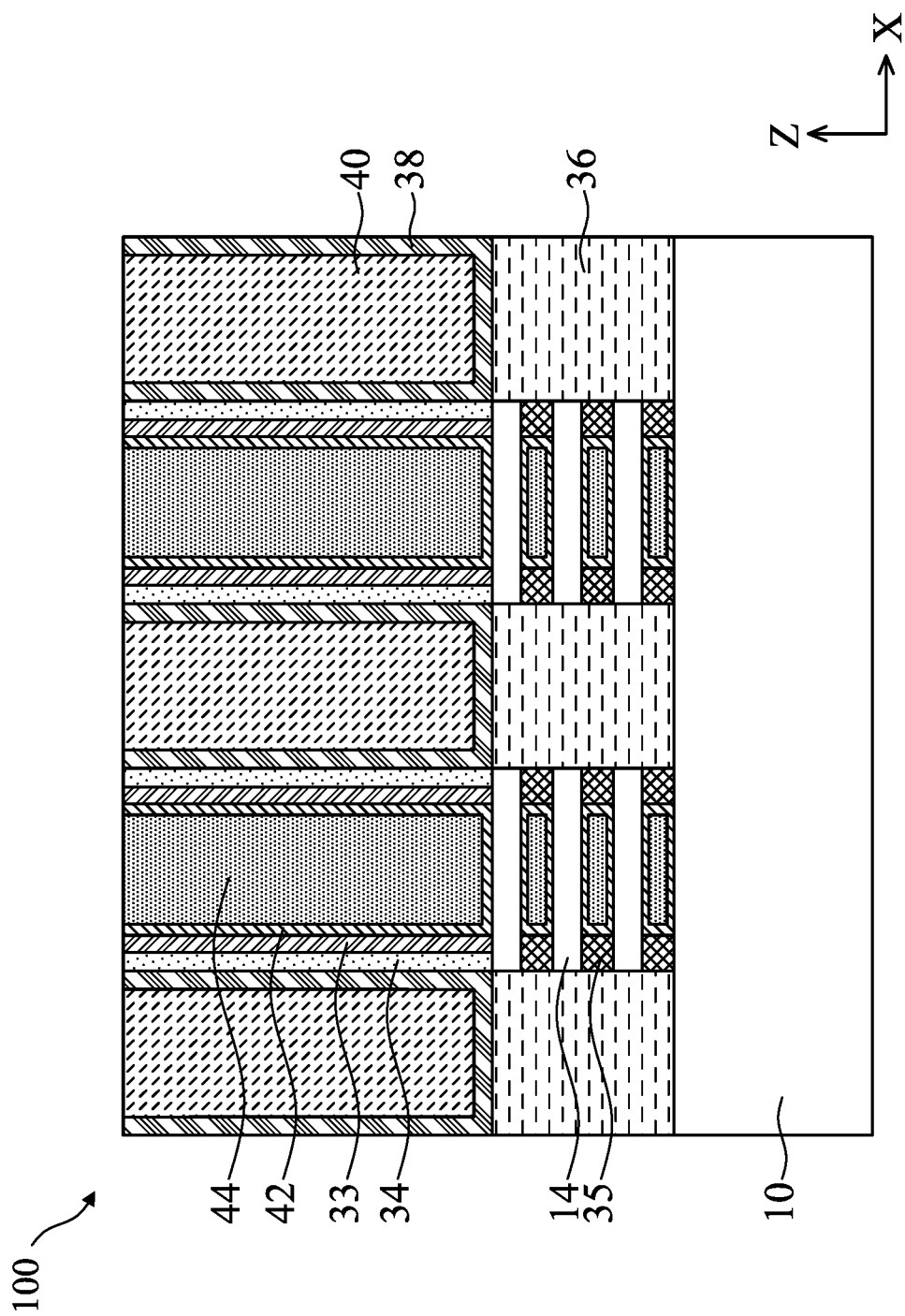
FIGS. 5-14 are cross sectional views of the semiconductor device structure along line A-A of FIG. 4 at various stages of fabrication according to embodiments of the present disclosure.

As shown in FIG. 5, a replacement gate sequence is performed to form a gate dielectric layer 42 and a gate electrode layer 44. The replacement gate sequence may include removing the sacrificial gate electrode layer 26 and the sacrificial gate dielectric layer 24 to expose the fin structure 20 under the sacrificial gate structure 32. The first semiconductor layers 12 are subsequently removed to form nanosheets of the second semiconductor layers 14. The source feature/terminal and the drain feature/terminal of the adjacent source/drain features 36 are connected by channel layers (e.g., the nanosheets of the second semiconductor layers 14).

The gate dielectric layer 42 is then deposited on exposed surfaces of each nanosheet of the second semiconductor layers 14, exposed surfaces of the inner spacers 35, and exposed surfaces of the sidewall spacers 33. The gate dielectric layer 42 may include one or more layers of a dielectric material, such as silicon oxide, silicon nitride, or high-k dielectric material, other suitable dielectric material, and/or combinations thereof. Examples of high-k dielectric material include HfO2, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof.

The gate electrode layer 44 is then formed over the gate dielectric layer 42. The gate electrode layer 44 includes one or more layers of conductive material (i.e., work function metal), such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. After the formation of the gate electrode layer 42, a planarization process, such as a CMP process, is performed to remove excess deposition of the gate electrode material and expose the top surface of the ILD layer 40.

FIG. 5 also shows that the one or more second semiconductor layers 14 connect the source/drain features 36 on opposing sides of the one or more second semiconductor layers 14, thereby forming a multichannel transistor. The one or more semiconductor layers 14 function as one or more channel regions between the source/drain features 36 of the multi-channel transistor. The connection between the source/drain features 36 may be controlled by the voltage applied to the gate electrode layer 44. Alternatively, the channel region may be a single channel transistor with a single channel fin-shape channel region or a planar channel region.

Figure 6:
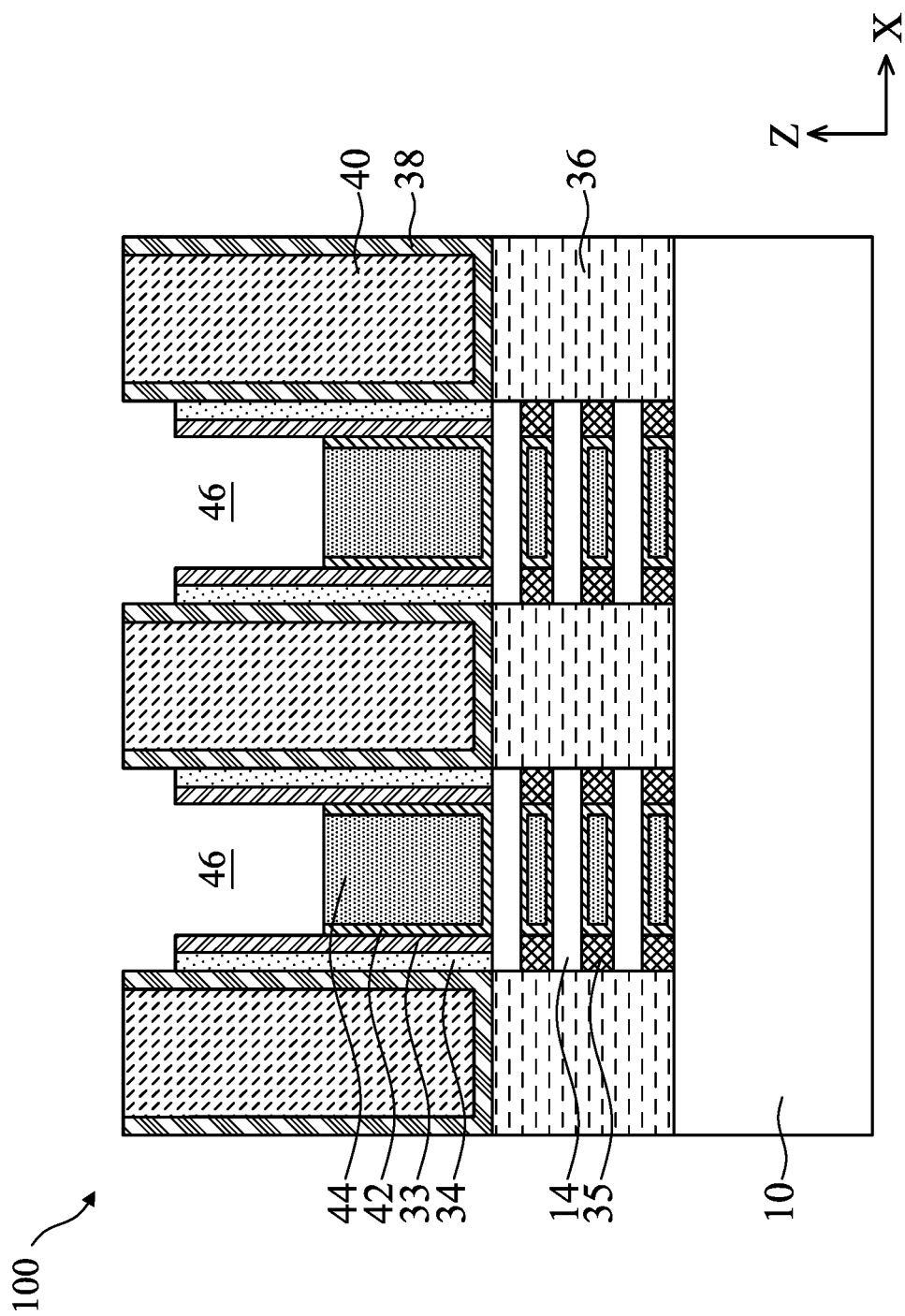

As shown in FIG. 6, a metal gate etching back (MGEB) process is performed to remove portions of the gate dielectric layer 42 and the gate electrode layer 44. Trenches 46 are formed in the region above the remaining gate dielectric layer 42 and gate electrode layer 44. The MGEB process may be a plasma etching process employing one or more etchants such as chlorine-containing gas, a bromine-containing gas, and/or a fluorine-containing gas. The etching process allows the gate dielectric layer 42 and the gate electrode layer 44 to be selectively etched without substantially affecting the sidewall spacers 33, 34, the ILD layer 40 and the CESL 38.

In some embodiments, the sidewall spacers 33, 34 are also etched back so that the top surfaces of the sidewall spacers 33, 34 are higher than the top surfaces of the gate dielectric layer 42 and the gate electrode layer 44. The top surfaces of the gate dielectric layer 42 and the gate electrode layer 44 are substantially co-planar. The gate dielectric layer 42, the gate electrode layer 44, and the sidewall spacers 33, 34 may be etched using two or more etch processes. For example, the gate dielectric layer 42 and the gate electrode layer 44 may be etched back to a first height using a first etch process, then the sidewall spacers 33, 34 are etched back to a second height that is substantially the same as the first height using a second etch process, and then the gate dielectric layer 42 and the gate electrode layer 44 are further etched back to a third height that is lower than the second height using a third etch process. Alternatively, the gate dielectric layer 42 and the gate electrode layer 44 may be etched back to a first height using a first etch process, then the sidewall spacers 33, 34 are etched back to a second height that is greater than the first height. In either case, the sidewall spacers 33, 34 are etched down to a level lower than the CESL 38 and higher than the gate dielectric layer 42 and the gate electrode layer 44, as shown in FIG. 6.

By etching the sidewall spacers 33, 34 below the CESL 38, the sidewall spacers 33, 34 can be covered and protected by the subsequently formed SAC layer while forming source/drain metal contacts. In addition, keeping the sidewall spacers 33, 34 at a level higher than the gate dielectric layer 42 and the gate electrode layer 44 allows the gate electrode layer 44 remain protected by the sidewall spacers 33, 34.

Figure 7:
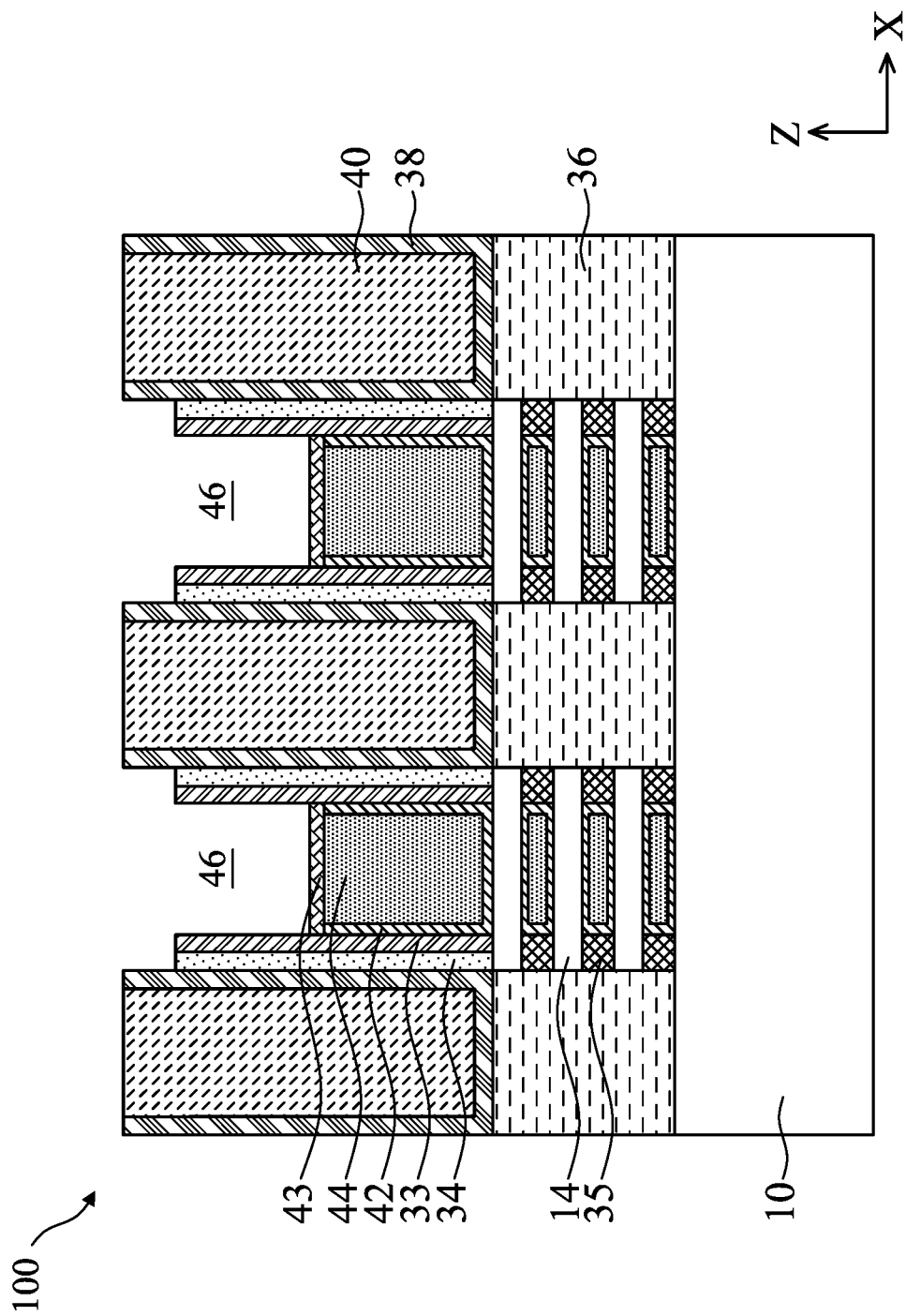

As shown in FIG. 7, a metal layer 43 is selectively formed on the gate electrode layer 44. In some embodiments, the metal layer 43 may also extend to cover a portion, or the entire top surface of the gate dielectric layer 42. Since the gate electrode layer 44 may include multiple layers of work function metal, the formation of the metal layer 43 allows the subsequent isolation layer (e.g., isolation layer 45 in FIG. 8) to form over the gate electrode layer 44 without having to deal with growth selectivity issues that may otherwise occur between different work function metals of the gate electrode layer 44 and the subsequent formed isolation layer if the metal layer 43 was not presented. The metal layer 43 may include or be formed of W, Ru, Mo, Co, TaN, Cu, Ti, Ta, TiN, or the like. The metal layer 43 may have a thickness of about 0.5 nm to about 10 nm. A metal layer 43 thinner than 0.5 nm may not be able to modulate the growth selectivity issues mentioned above. On the other hand, if the thickness of the metal layer 43 is greater than 10 nm, the manufacturing cost is increased without significant advantage. The metal layer 43 may be formed by PVD, CVD, ALD, or other suitable process. The metallic surfaces of the multiple layers of work function of metal of the gate electrode layer 44 promote selective growth of the metal layer 43 on the gate electrode layer 44, but not on the dielectric material of the sidewall spacers 33, 34, the CESL 38, and the ILD layer 40. Thus, the metal layer 43 may be formed in a bottom-up fashion. In some embodiments, the metal layer 43 is optional and may not exist.

Figure 8:
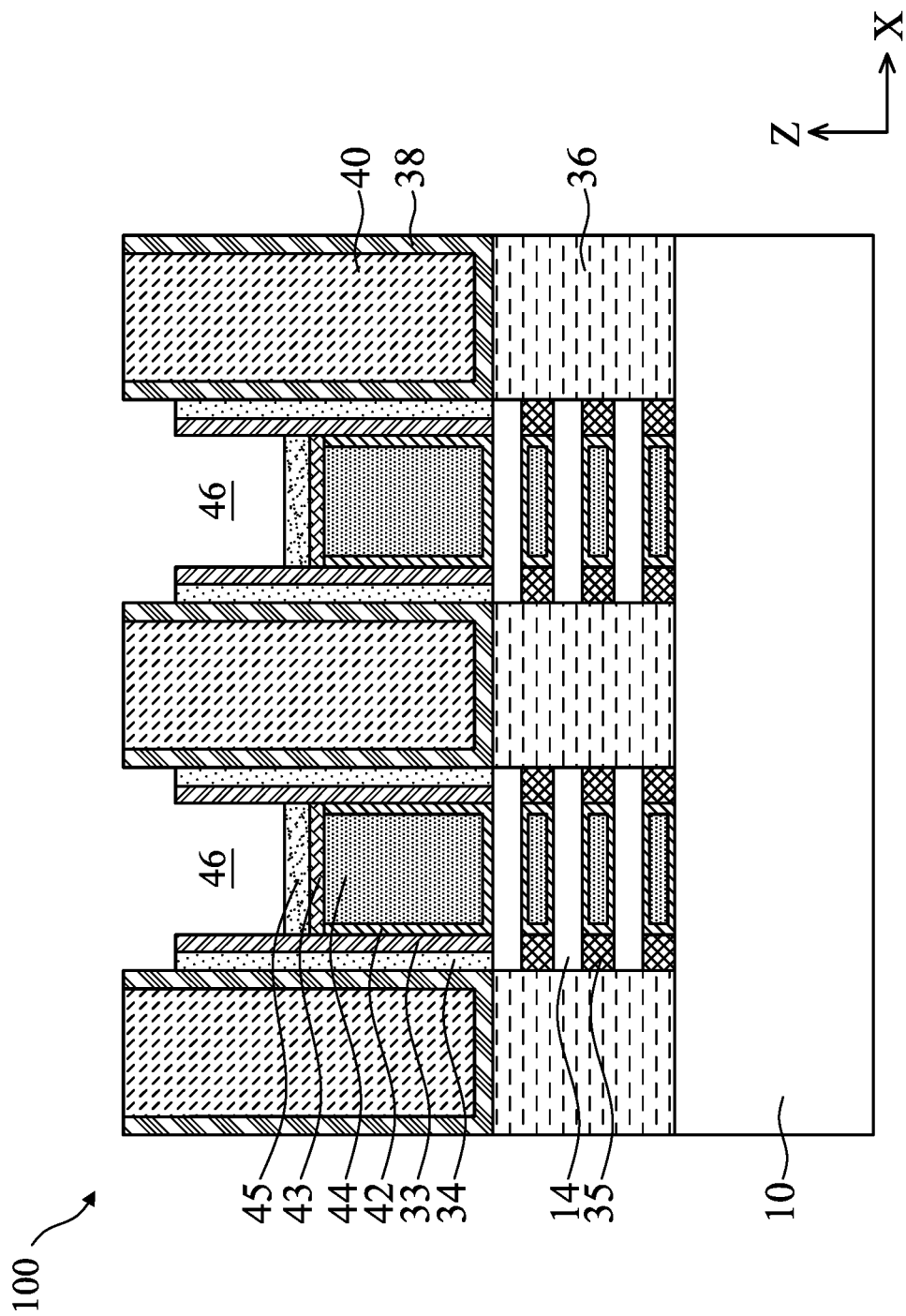

As shown in FIG. 8, an isolation layer 45 is formed on the metal layer 43. The isolation layer 45 serves as a protection layer to prevent oxidation of the metal layer 43 and the gate electrode layer 44 during subsequent processes, such as the deposition of a self-aligned contact (e.g., the first SAC layer 50 in FIG. 9). The material of the isolation layer 45 is chosen so that it does not oxidize the metal layer 43 and the gate electrode layer 44. In various embodiments, the isolation layer 45 is formed of a dielectric material that is free of oxygen atoms. Exemplary materials for the isolation layer 45 may include, but are not limited to, ZrN, SiC, SiN, SiCN, TaCN, or the like, or any combination thereof. In some embodiments, the isolation layer 45 is formed of a material different than the materials used for the sidewall spacers 33, 34 and the CESL 38. The isolation layer 45 may be selectively formed on the metal layer 43 using any suitable selective deposition process, such as ALD. The precursors and the temperature for forming the isolation layer 45 can be controlled to achieve selective or preferential growth of the isolation layer 45 on the metallic surface of the metal layer 43 over the dielectric surfaces of the sidewall spacers 33, 34, the CESL 38, and the ILD layer 40. Alternatively, the isolation layer 45 may be conformally formed on the metal layer 43 and exposed surfaces of the semiconductor device structure 100, and then one or more selective etch processes (e.g., atomic layer etch (ALE)) are performed to remove the isolation layer 45 from the exposed surfaces of the semiconductor device structure 100 without damaging the isolation layer 45 on the metal layer 43. The isolation layer 45 may have a thickness of about 0.5 nm to about 10 nm. An isolation layer 45 thinner than 0.5 nm may not be able to function as a protection layer. On the other hand, if the thickness of the isolation layer 45 is greater than 10 nm, the manufacturing cost is increased without significant advantage.

Figure 9:
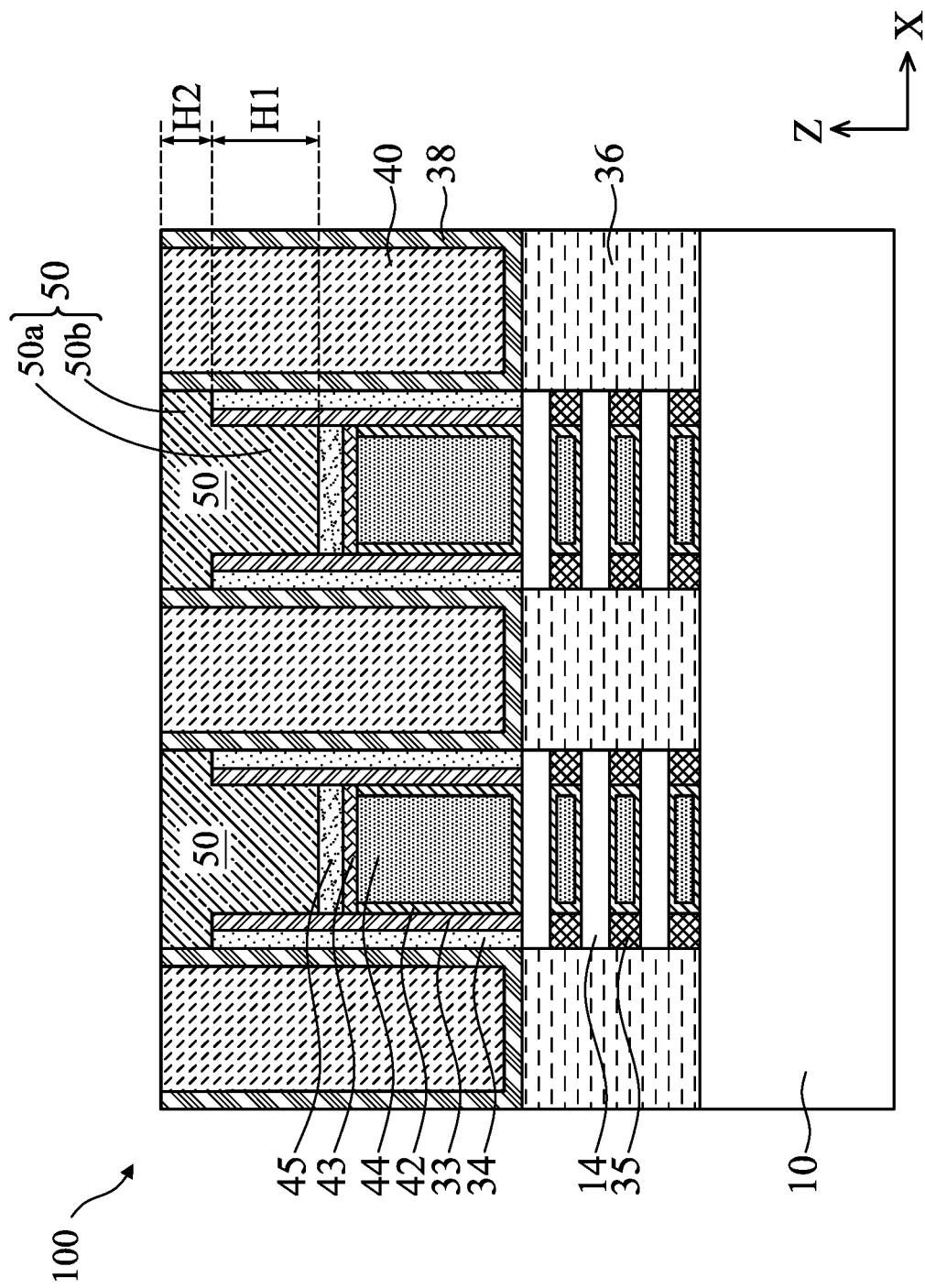

As shown in FIG. 9, a first self-aligned contact (SAC) layer 50 is filled in the trenches 46 (FIG. 8) above the isolation layer 45. The first SAC layer 50 can be used as an etch stop layer during subsequent trench and via patterning for metal contacts. The profile of the trenches 46 results in the first SAC layer 50 having a bottom portion 50a and a top portion 50b extending from the bottom portion 50a. The bottom portion 50a is in contact with the isolation layer 45 and the sidewall spacer 33 and the top portion 50b is in contact with the sidewall spacers 33, 34 and the CESL 38. The bottom portion 50a may have a height H1 in a range between about 1 nm and about 40 nm. The top portion 50b may have a height H2 in a range between about 1 nm and about 20 nm. A first SAC layer 50 thinner than the combination of H1 and H2 may not be able to function as an etch stop layer in the subsequent process. On the other hand, if the thickness of the first SAC layer 50 is greater than the combination of H1 and H2, the dimension of the device will increase without additional benefit.

The first SAC layer 50 may be any dielectric material that has different etch selectivity than the CESL layer 38 and the subsequently formed source/drain metal contact (e.g., source/drain metal contacts 56 in FIG. 12). In some embodiments, the first SAC layer 50 may be a high-k dielectric layer having a K value of about 3.9 or greater, such as about 7 or greater. In some embodiments, the first SAC layer 50 is formed of a material different than the material used for the isolation layer 45. Suitable materials for the first SAC layer 50 may include, but are not limited to, SiO, HfSi, SiOC, AlO, ZrSi, AlON, ZrO, HfO, TiO, ZrAlO, ZnO, TaO, LaO, YO, TaCN, SiN, SiOCN, SiOCN, ZrN, SiCN, or any combinations thereof. The first SAC layer 50 may be formed by a suitable deposition process, such as CVD, FCVD, PVD, or ALD.

Although the first SAC layer 50 may contain oxygen in some embodiments, the formation of the isolation layer 45 between the first SAC layer 50 and the gate electrode layer 44 can block diffusion of the oxygen into the gate electrode layer 42. As a result, the oxidation of the gate electrode layer 44, which may otherwise occur and result in metal work function shift and degradation of the device performance if the isolation layer 45 was not presented, is minimized or eliminated.

In some embodiments, the first SAC layer 50 is optional and may not exist. In such cases, the gate electrode layer 44 and the gate dielectric layer 42 are etched back, and then the metal layer 43 and the isolation layer 45 are formed on the gate electrode layer 44 and the gate dielectric layer 42. The top surface of the isolation layer 45 is coplanar with the top surfaces of the sidewall spacers 33, 34 and the CESL 38.

After filling the trenches 46 with the first SAC layer 50, a planarization process, such as a CMP process, is performed to remove excess deposition of the first SAC layer 50 to expose the top surface of the ILD layer 40.

Figure 10:
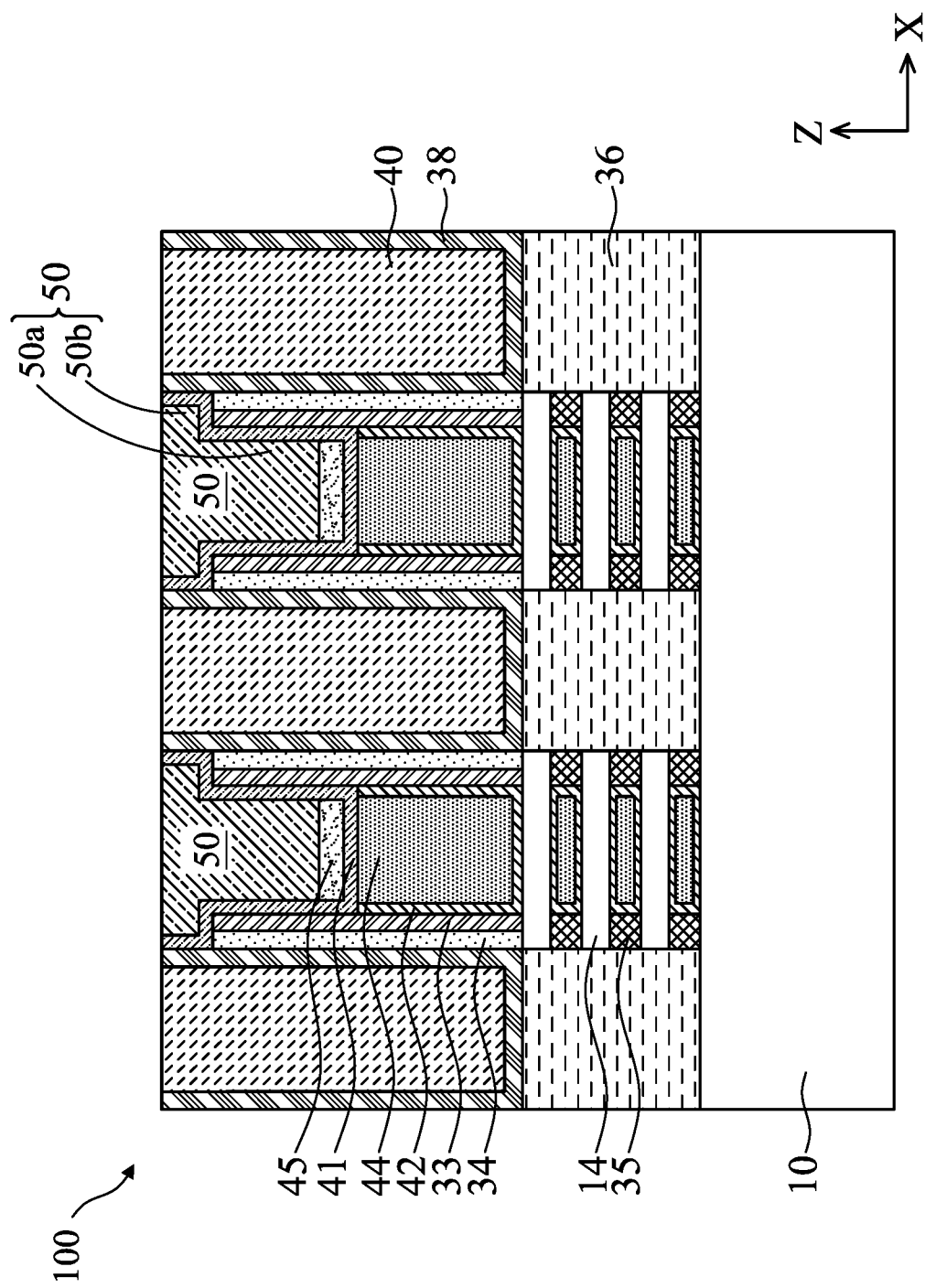

In some alternative embodiments shown in FIG. 10, after the MGEB process, the metal layer 43 is omitted. Instead, a liner layer 41 may be first deposited on exposed surfaces in the trenches 46 prior to forming the isolation layer 45 and filling the trenches 46 with the first SAC layer 50. The liner layer 41 may function as a diffusion barrier for the gate electrode layer 44 and prevent oxidation of the gate electrode layer 44 during subsequent processes. The liner layer 41 is a conformal layer in contact with the isolation layer 45, the gate electrode layer 44, the gate dielectric layer 42, the sidewall spacers 33, 34, the CESL 38, and the first SAC layer 50, as shown in FIG. 10. In some embodiments, the isolation layer 45 may be omitted. The liner layer 41 may be formed of a dielectric layer that is free of oxygen atoms so that it does not oxidize the gate electrode layer 44. Suitable materials for the liner layer 41 may include, but are not limited to, SiN, SiC, SiCN, ZrN, or the like, or any combination thereof. The liner layer 41 may be formed by a suitable deposition process, such as ALD, CVD, or PVD.

Figure 11:
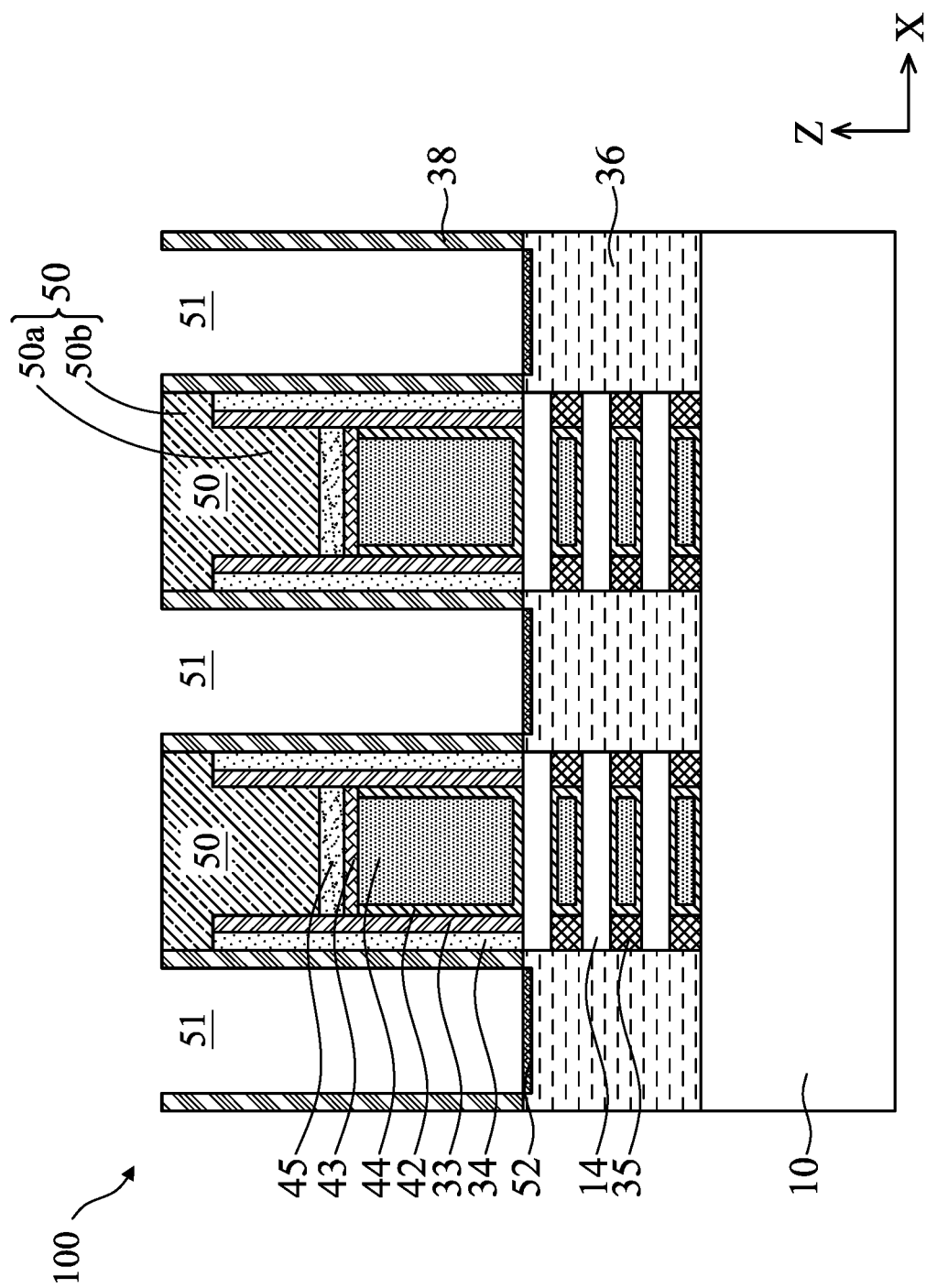
Figure 12:
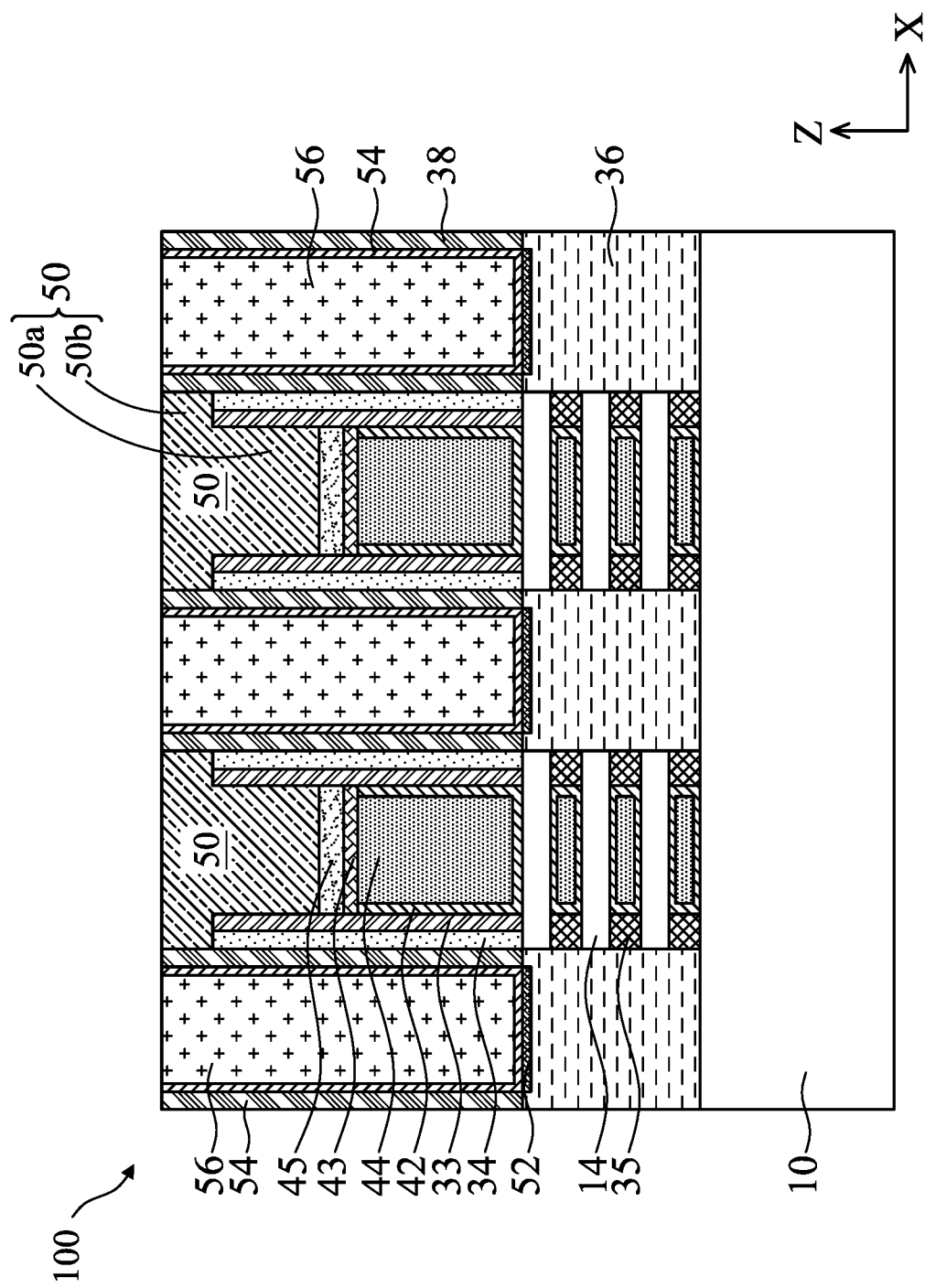
Figure 13:
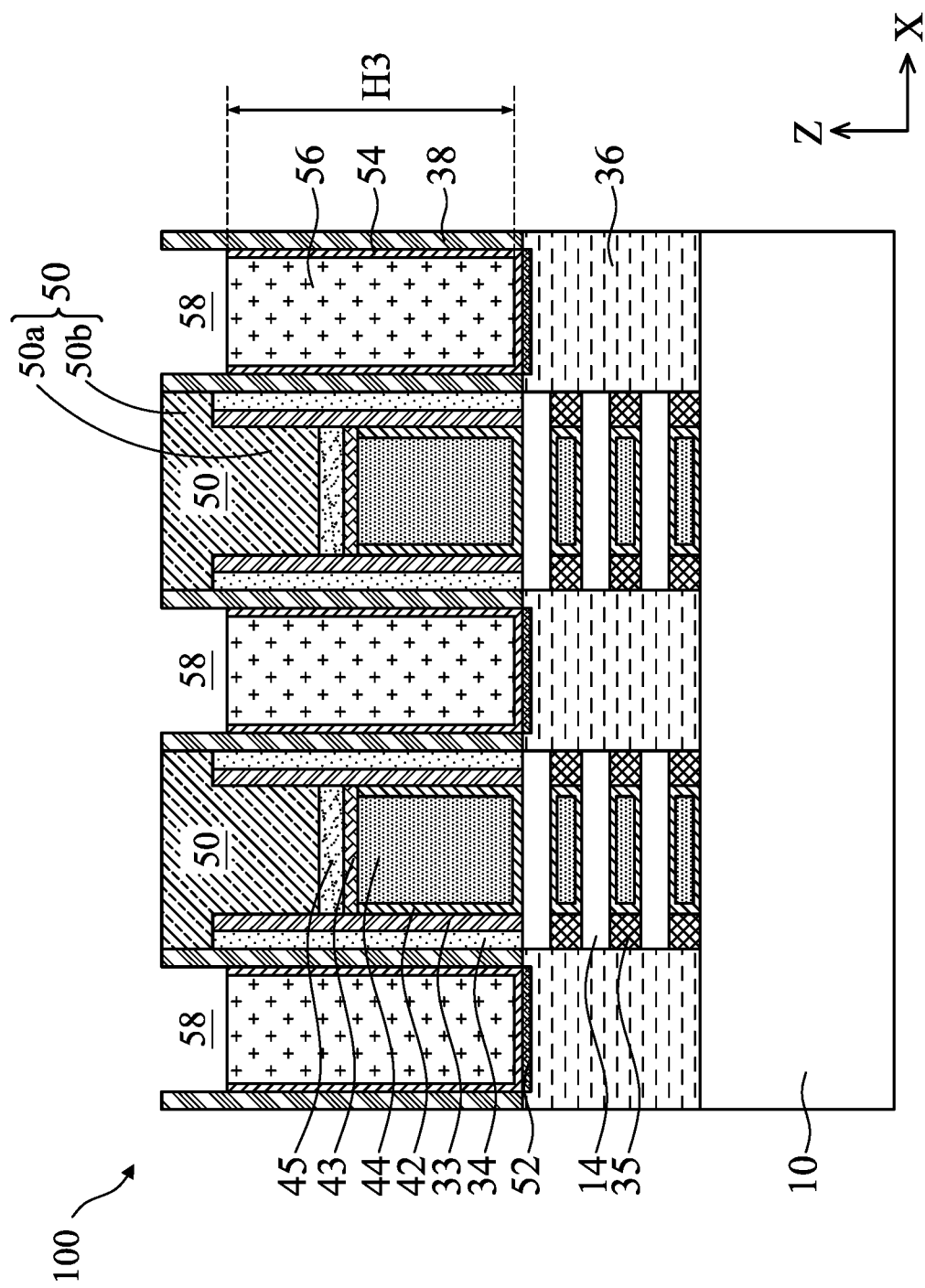
Figure 14:
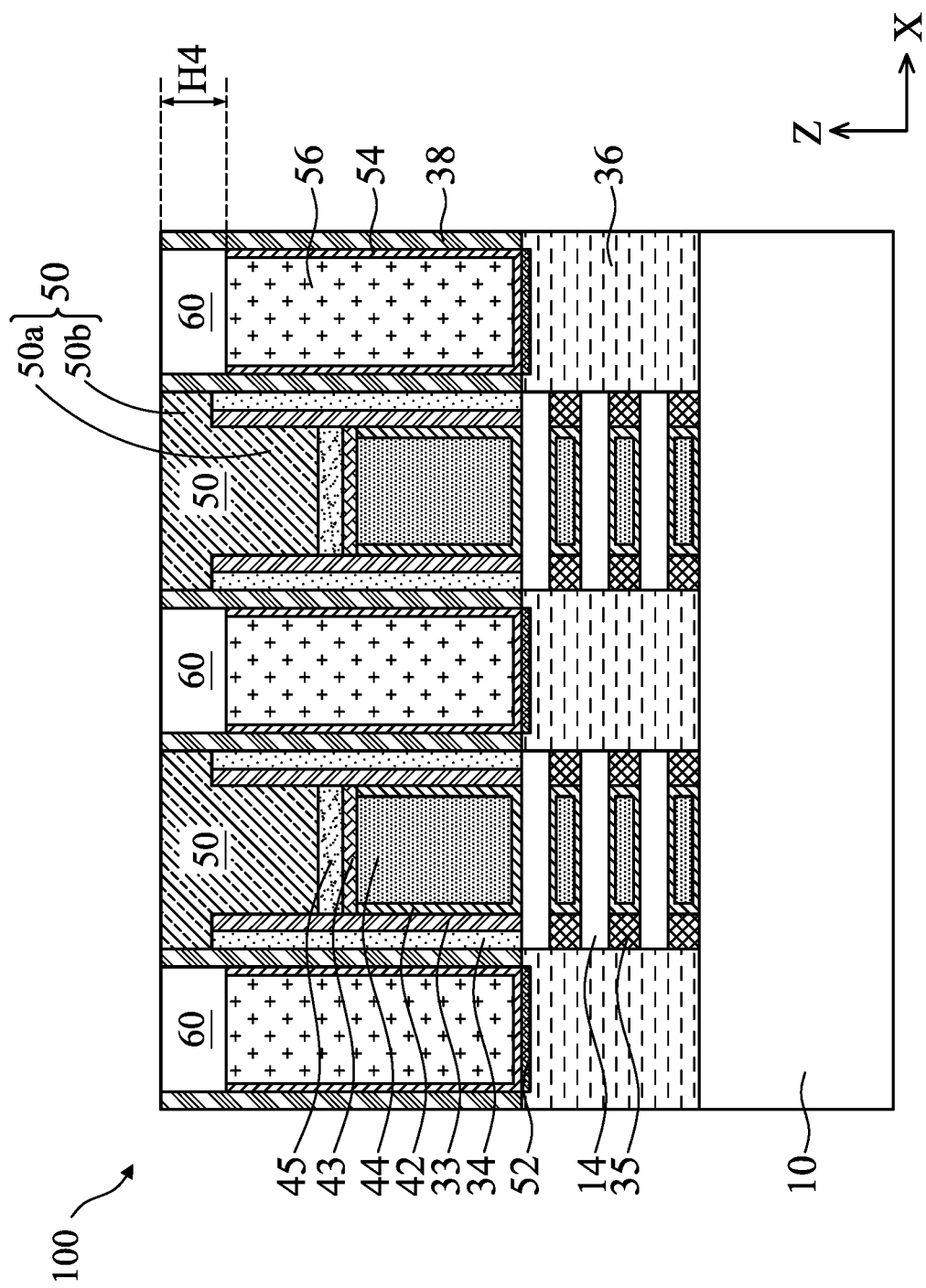

As shown in FIGS. 11 and 12, source/drain metal contacts 56 are formed. Contact holes 51 may be formed through the ILD layer 40 and the CESL 38 and subsequently filled with a conductive material to form the source/drain metal contacts 56. Suitable photolithographic and etching techniques are used to form the contact holes 51 through various layers to expose a top surface of the source/drain features 36. In some embodiments, the contact holes 51 may be formed over all source/drain features 36 to form source/drain metal contacts 56 thereon to achieve structure balance. In other embodiments, the contact holes 51 are formed over selected source/drain features 36 to be connected to power supply or signal lines from the top side.

After the formation of the contact holes 51, a silicide layer 52 is selectively formed over a top surface of the source/drain features 36 exposed by the contact holes 51, as shown in FIG. 11. The silicide layer 52 conductively couples the source/drain features 36 to the subsequently formed source/drain metal contacts 56. The silicide layer 52 may be formed by depositing a metal source layer to cover exposed surfaces including the exposed surfaces of the source/drain features 36 and performing a rapid thermal annealing process. In some embodiments, the metal source layer includes a metal layer selected from but not limited Ti, TiSi, Co, CoSi, Ni, NiSi, NiCo, Pt, Ni(Pt), Jr, Pt(Ir), Er, Yb, Pd, Rh, Nb, WSi, or TiSiN. After the formation of the metal source layer, a rapid thermal anneal process is performed, for example, a rapid anneal at a temperature between about 700° C. and about 900° C. During the rapid anneal process, the portion of the metal source layer over the source/drain features 36 reacts with silicon in the source/drain features 36 to form the silicide layer 52. Unreacted portion of the metal source layer is then removed. In some embodiments, the silicide layer 52 may have a thickness in a range between about 0.5 nm and 10 nm.

After formation of the silicide layer 52, a conductive material is deposited to fill contact holes 51 and form the source/drain metal contacts 56, as shown in FIG. 12. In some embodiments, a barrier layer 54 is formed over exposed surfaces of the silicide layer 52 and the CESL 38 prior to filling the source/drain metal contacts 56. In some embodiments, the barrier layer 54 may be formed from Ti, Ta, TiN, TaN, W, Co, Ru, or the like. The barrier layer 54 may have a thickness less than about 10 nm. The source/drain metal contacts 56 may be formed from a conductive material. In some embodiments, the conductive material for the side source/drain metal contacts 56 includes but not limited to W, Co, Ru, Ti, Ni, Cu, Au, Ag, Pt, Pd, Ir, Os, Rh, Al, Mo, TaN, or the like.

In some embodiments, the source/drain metal contacts 56 may be formed by a suitable deposition process, such as CVD, PVD, plating, ALD, or other suitable technique. Subsequently, a CMP process is performed to remove a portion of the conductive material layer above a top surface of the first SAC layer 50.

As shown in FIGS. 13, 14, 15, and 16, the source/drain metal contacts 56 are etched back to form isolation holes 58, and second self-aligned contact (SAC) layers 60 are formed in the isolation holes 58. The isolation holes 58 may be formed by a plasma etching process employing one or more etchants such as chlorine-containing gas, a bromine-containing gas, and/or a fluorine-containing gas. The etching process allows the source/drain metal contacts 56 to be selectively etched, while the first SAC layer 50, the barrier layer 54, the CESL 38, and the ILD layer 40 are not substantially affected. The source/drain metal contacts 56 have a height H3 after etch back. In some embodiments, the height H3 in a range between about 0.5 nm and about 90 nm, for example about 5 nm to about 40 nm.

In some embodiments, the second SAC layer 60 is formed of a material different than the material used for the first SAC layer 50 so that the second SAC layer 60 can be selectively removed with respect to the SAC layer 50 during the subsequent process. Suitable materials for the second SAC layer 60 may include, but are not limited to, SiO, HfSi, SiOC, AlO, ZrSi, AlON, ZrO, HfO, TiO, ZrAlO, ZnO, TaO, LaO, YO, TaCN, SiN, Si, SiOCN, ZrN, SiCN, or any combinations thereof. The second SAC layers 60 may be formed by a suitable deposition process, such as CVD, PVD, plating, ALD, or other suitable technique. In some embodiments, the second SAC layers 60 are optional and may not exist. That is, the barrier layer 54 and the source/drain metal contacts 56 are not etched back. The second SAC layers 60 may be removed in subsequent process and serve as self-alignment feature for contact holes to connect with the source/drain metal contacts 56.

Subsequently, a CMP process is performed to remove a portion of the second SAC layers 60 above a top surface of the first SAC layer 50. In some embodiments, the second SAC layers 60 may have a height H4 in a range between about 1 nm and about 50 nm.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. In addition, the semiconductor device structure 100 may also include backside contacts (not shown) on the backside of the substrate 101 so that either source or drain of the source/drain features 36 is connected to a backside power rail (e.g., positive voltage VDD or negative voltage VSS) through the backside contacts.

Embodiments of the present disclosure prevent gate electrode layer in a semiconductor device from oxidation by covering a top surface of the gate electrode layer with a metal layer and an isolation layer on the metal layer. The isolation layer is formed between a first SAC layer and the gate electrode layer to prevent diffusion of the oxygen from the first SAC layer into the gate electrode layer. As a result, the oxidation of the gate electrode layer, which may otherwise occur and result in metal work function shift and degradation of the device performance if the isolation layer was not presented, is minimized or eliminated.

Some embodiments of the present disclosure provide a semiconductor device structure. The semiconductor device structure includes a gate dielectric layer, a gate electrode layer in contact with the gate dielectric layer, a first self-aligned contact (SAC) layer disposed over the gate electrode layer, an isolation layer disposed between the gate electrode layer and the first SAC layer, and a first sidewall spacer in contact with the gate dielectric layer, the isolation layer, and the first SAC layer.

Some embodiments of the present disclosure provide a semiconductor device structure. The semiconductor device structure includes first and second source/drain features, a channel layer disposed between and in contact with the first and second source/drain features, wherein the channel layer is formed of a semiconductor layer. The semiconductor device structure also includes a gate dielectric layer surrounding at least a surface the channel layer, a gate electrode layer surrounding at least a surface of the gate dielectric layer, a first self-aligned contact (SAC) layer disposed over the gate electrode layer, wherein the SAC layer comprises a dielectric material. The semiconductor device structure further includes an isolation layer disposed between the gate electrode layer and the first SAC layer, and a first sidewall spacer in contact with the gate dielectric layer, the first SAC layer, and the isolation layer.

Some embodiments of the present disclosure provide a method for forming a semiconductor device structure. The method includes forming a fin structure having a plurality of channel layers disposed thereover, forming a sacrificial gate structure over a portion of the fin structure, forming a sidewall spacer on opposing sides of the sacrificial gate structure, removing the sacrificial gate structure to expose portions of the plurality of channel layers, forming a gate dielectric layer on exposed portions of the plurality of channel layers, forming a gate electrode layer on the gate dielectric layer, removing portions of the gate electrode layer and the gate dielectric layer so that top surfaces of the gate electrode layer and the gate dielectric layer are lower than a top surface of the sidewall spacer, forming an isolation layer over the gate electrode layer and the gate dielectric layer, wherein the isolation layer comprises a dielectric material free of oxygen atoms, and forming a self-aligned contact (SAC) layer on the isolation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
   a gate dielectric layer;
   a gate electrode layer in contact with the gate dielectric layer;
   a first self-aligned contact (SAC) layer disposed over the gate electrode layer;
   an isolation layer disposed over the gate electrode layer;
   a metal layer disposed between and in contact with the gate electrode layer and the isolation layer; and
   a first sidewall spacer in contact with the gate dielectric layer, the isolation layer, and the first SAC layer.

2. The semiconductor device structure of claim 1, wherein the isolation layer is formed of a dielectric material free of oxygen atoms.

3. The semiconductor device structure of claim 1, wherein the isolation layer is in contact with the first SAC layer.

4. The semiconductor device structure of claim 1, wherein the metal layer is further in contact with the gate dielectric layer.

5. The semiconductor device structure of claim 1, wherein the first sidewall spacer is in contact with the metal layer.

6. The semiconductor device structure of claim 5, further comprising:
   a second sidewall spacer in contact with the first sidewall spacer.

7. The semiconductor device structure of claim 6, further comprising:
a contact etch stop layer (CESL) in contact with the second sidewall spacer and the first SAC layer.

8. The semiconductor device structure of claim 7, further comprising:
a source/drain metal contact disposed adjacent the CESL; and
a second self-aligned contact (SAC) layer in contact with the source/drain metal contact and the CESL.

9. A semiconductor device structure, comprising:
first and second source/drain features;
a channel layer disposed between and in contact with the first and second source/drain features, wherein the channel layer is formed of a semiconductor layer;
a gate dielectric layer surrounding at least a surface of the channel layer;
a gate electrode layer surrounding at least a surface of the gate dielectric layer;
a first self-aligned contact (SAC) layer disposed over the gate electrode layer, wherein the SAC layer comprises a dielectric material;
an isolation layer disposed over the gate electrode layer;
a metal layer disposed between and in contact with the gate electrode layer and the isolation layer; and
a first sidewall spacer in contact with the gate dielectric layer, the first SAC layer, and the isolation layer.

10. The semiconductor device structure of claim 9, wherein the isolation layer is formed of a dielectric material free of oxygen atoms.

11. The semiconductor device structure of claim 9, further comprising:
a second sidewall spacer in contact with the first sidewall spacer and the first SAC layer.

12. The semiconductor device structure of claim 11, further comprising:
a source/drain metal contact disposed over the first and second source/drain features;
a second self-aligned contact (SAC) layer in contact with the source/drain metal contact; and
a contact etch stop layer (CESL) disposed between and in contact with the second SAC and the first SAC layer.

13. The semiconductor device structure of claim 9, further comprising:
a liner layer in contact with the gate electrode layer.

14. The semiconductor device structure of claim 13, wherein the liner layer is formed of a dielectric material free of oxygen atoms.

15. The semiconductor device structure of claim 13, further comprising:
a second sidewall spacer in contact with the first sidewall spacer and the liner layer; and
a contact etch stop layer (CESL) in contact with the liner layer and the second sidewall spacer.

16. The semiconductor device structure of claim 15, further comprising:
a source/drain metal contact disposed over the first and second source/drain features; and
a second self-aligned contact (SAC) layer in contact with the source/drain metal contact.

17. A method for forming a semiconductor device structure, comprising:
forming a fin structure having a plurality of channel layers disposed thereover;
forming a sacrificial gate structure over a portion of the fin structure;
forming a sidewall spacer on opposing sides of the sacrificial gate structure;
removing the sacrificial gate structure to expose portions of the plurality of channel layers;
forming a gate dielectric layer on exposed portions of the plurality of channel layers;
forming a gate electrode layer on the gate dielectric layer;
removing portions of the gate electrode layer and the gate dielectric layer so that top surfaces of the gate electrode layer and the gate dielectric layer are lower than a top surface of the sidewall spacer;
forming a metal layer over the gate electrode layer;
forming an isolation layer over the gate electrode layer and the gate dielectric layer, wherein the isolation layer comprises a dielectric material free of oxygen atoms; and
forming a self-aligned contact (SAC) layer on the isolation layer.

18. The method of claim 17, wherein the metal layer is disposed between and in contact with the gate electrode layer and the isolation layer.

* * * * *